US011373713B1

United States Patent
Zeng et al.

(10) Patent No.: US 11,373,713 B1
(45) Date of Patent: Jun. 28, 2022

(54) MEMORY CONTROL METHOD, MEMORY STORAGE DEVICE, AND MEMORY CONTROL CIRCUIT UNIT

(71) Applicant: PHISON ELECTRONICS CORP., Miaoli (TW)

(72) Inventors: Shih-Jia Zeng, Hsinchu (TW); Lih Yuarn Ou, Hsinchu County (TW); Hsiao-Yi Lin, Yilan County (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 17/209,214

(22) Filed: Mar. 22, 2021

(30) Foreign Application Priority Data

Mar. 3, 2021 (TW) ................................. 110107490

(51) Int. Cl.
  *G11C 16/34* (2006.01)
  *G11C 16/26* (2006.01)
  *G11C 16/30* (2006.01)
(52) U.S. Cl.
  CPC .......... *G11C 16/3404* (2013.01); *G11C 16/26* (2013.01); *G11C 16/30* (2013.01)
(58) Field of Classification Search
  None
  See application file for complete search history.

(56) References Cited

U.S. PATENT DOCUMENTS

| 9,715,429 B1 * | 7/2017 | Lin | G11C 16/349 |
| 2017/0271031 A1 * | 9/2017 | Sharon | G06F 11/3058 |

FOREIGN PATENT DOCUMENTS

| TW | 201837916 | 10/2018 |
| TW | 201916047 | 4/2019 |

OTHER PUBLICATIONS

"Office Action of Taiwan Counterpart Application", dated Dec. 22, 2021, p. 1-p. 9.

* cited by examiner

Primary Examiner — Tan T. Nguyen
(74) Attorney, Agent, or Firm — JCIPRNET

(57) ABSTRACT

A memory control method, a memory storage device, and a memory control circuit unit are provided. The memory control method includes: reading multiple first memory cells using multiple read voltage levels to obtain a first threshold voltage distribution of the first memory cells; obtaining shift information of the first threshold voltage distribution with respect to an original threshold voltage distribution of the first memory cells; obtaining first reliability information corresponding to the first threshold voltage distribution; recovering original reliability information corresponding to the original threshold voltage distribution according to a statistical characteristic of the first reliability information; adjusting the original reliability information according to the shift information to obtain second reliability information corresponding to the first threshold voltage distribution; and updating reliability information related to the first memory cells according to the second reliability information.

21 Claims, 9 Drawing Sheets

$$\left._{k}\left\{\begin{array}{ccccccccc} \overbrace{0 & 0 & 1 & 0 & 1 & 0 & 0 & 1 & 1}^{n} \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{array}\right.\right]\longleftarrow 600$$

| voltage range | B | C | D | E | F | G |
|---|---|---|---|---|---|---|
| total number of memory cells | 820 | 357 | 260 | 826 | 2550 | 4759 |
| LLR(1) | −12 | −6 | −1 | 5 | 10 | 16 |
| LLR(0) | −14 | −8 | −3 | 3 | 8 | 14 |
| LLR(2) | −11 | −5 | 0 | 6 | 11 | 17 |

1101 recover

MEMORY CONTROL METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 110107490, filed on Mar. 3, 2021. The entirety of the above-mentioned patent application is hereby incorporated by reference herein and made a part of this specification.

BACKGROUND

Technical Field

The disclosure relates to a memory control technology, and particularly relates to a memory control method, a memory storage device, and a memory control circuit unit.

Description of Related Art

Digital cameras, mobile phones, and MP3 players have grown rapidly over the past few years, which has led to a rapid increase in consumer demand for storage media. Since the rewritable non-volatile memory module (for example, the flash memory) has the characteristics such as non-volatile data, power saving, small size, and no mechanical structure, the rewritable non-volatile memory module is very suitable for being built into the various portable multi media devices exemplified above.

Generally speaking, in order to ensure the correctness of data, the data is first encoded and then stored into the rewritable non-volatile memory module. When reading the data from the rewritable non-volatile memory module, the read data is decoded to try to correct any error in the data. However, when the threshold voltage distribution of memory cells in the rewritable non-volatile memory module shifts, the decoding performance when decoding the data read from the memory cells generally decreases.

SUMMARY

The disclosure provides a memory control method, a memory storage device, and a memory control circuit unit, which can dynamically update reliability information related to specific memory cells, thereby improving the decoding performance of data subsequently read from the memory cells.

An exemplary embodiment of the disclosure provides a memory control method, which is used in a rewritable non-volatile memory module. The rewritable non-volatile memory module includes multiple memory cells. The memory control method includes the following steps. Multiple first memory cells in the memory cells are read using multiple read voltage levels to obtain a first threshold voltage distribution of the first memory cells. Shift information of the first threshold voltage distribution with respect to an original threshold voltage distribution of the first memory cells is obtained. First reliability information corresponding to the first threshold voltage distribution is obtained. Original reliability information corresponding to the original threshold voltage distribution is recovered according to a statistical characteristic of the first reliability information. The original reliability information is adjusted according to the shift information to obtain second reliability information corresponding to the first threshold voltage distribution. Reliability information related to the first memory cells is updated according to the second reliability information.

In an exemplary embodiment of the disclosure, the step of obtaining the shift information of the first threshold voltage distribution with respect to the original threshold voltage distribution of the first memory cells includes the following step. The shift information is obtained according to a difference between the total number and a predetermined number.

In an exemplary embodiment of the disclosure, the step of obtaining the shift information of the first threshold voltage distribution with respect to the original threshold voltage distribution of the first memory cells includes the following steps. A distribution curve is determined according to the memory cell number distribution. The shift information is obtained according to a characteristic parameter of the distribution curve.

In an exemplary embodiment of the disclosure, the step of recovering the original reliability information corresponding to the original threshold voltage distribution according to the statistical characteristic of the first reliability information includes the following steps. An adjustment value is determined according to the statistical characteristic of the first reliability information. The first reliability information is adjusted according to the adjustment value to obtain the original reliability information.

An exemplary embodiment of the disclosure further provides a memory storage device, which includes a connection interface unit, a rewritable non-volatile memory module, and a memory control circuit unit. The connection interface unit is configured to couple to a host system. The rewritable non-volatile memory module includes multiple memory cells. The memory control circuit unit is coupled to the connection interface unit and the rewritable non-volatile memory module. The memory control circuit unit is configured to send a read command sequence to instruct to read multiple first memory cells in the memory cells using multiple read voltage levels to obtain a first threshold voltage distribution of the first memory cells. The memory control circuit unit is further configured to obtain shift information of the first threshold voltage distribution with respect to an original threshold voltage distribution of the first memory cells. The memory control circuit unit is further configured to obtain first reliability information corresponding to the first threshold voltage distribution. The memory control circuit unit is further configured to recover original reliability information corresponding to the original threshold voltage distribution according to a statistical characteristic of the first reliability information. The memory control circuit unit is further configured to adjust the original reliability information according to the shift information to obtain second reliability information corresponding to the first threshold voltage distribution. The memory control circuit unit is further configured to update reliability information related to the first memory cells according to the second reliability information.

The exemplary embodiment of the disclosure further provides a memory control circuit unit, which is configured to control a rewritable non-volatile memory module. The rewritable non-volatile memory module includes multiple memory cells. The memory control circuit unit includes a host interface, a memory interface, and a memory management circuit. The host interface is configured to couple to the host system. The memory interface is configured to couple to the rewritable non-volatile memory module. The memory management circuit is coupled to the host interface and the memory interface. The memory management circuit is configured to send a read command sequence to instruct to read multiple first memory cells in the memory cells using multiple read voltage levels to obtain a first threshold voltage distribution of the first memory cells. The memory management circuit is further configured to obtain shift information of the first threshold voltage distribution with respect to an original threshold voltage distribution of the first memory cells. The memory management circuit is further configured to obtain first reliability information corresponding to the first threshold voltage distribution. The memory management circuit is further configured to recover original reliability information corresponding to the original threshold voltage distribution according to a statistical characteristic of the first reliability information. The memory management circuit is further configured to adjust the original reliability information according to the shift information to obtain second reliability information corresponding to the first threshold voltage distribution. The memory management circuit is further configured to update reliability information related to the first memory cells according to the second reliability information.

In an exemplary embodiment of the disclosure, the read voltage levels are divided into multiple voltage ranges on the first threshold voltage distribution, and the first threshold voltage distribution includes a memory cell number distribution presented based on the voltage ranges.

In an exemplary embodiment of the disclosure, the memory cell number distribution reflects a total number of memory cells whose threshold voltages fall within one of the voltage ranges.

In an exemplary embodiment of the disclosure, the operation of obtaining the shift information of the first threshold voltage distribution with respect to the original threshold voltage distribution of the first memory cells includes the following step. The shift information is obtained according to a difference between the total number and a predetermined number.

In an exemplary embodiment of the disclosure, the operation of obtaining the shift information of the first threshold voltage distribution with respect to the original threshold voltage distribution of the first memory cells includes the following steps. A distribution curve is determined according to the memory cell number distribution. The shift information is obtained according to a characteristic parameter of the distribution curve.

In an exemplary embodiment of the disclosure, the characteristic parameter includes one of a slope value and a low point position of the distribution curve.

In an exemplary embodiment of the disclosure, the operation of recovering the original reliability information corresponding to the original threshold voltage distribution according to the statistical characteristic of the first reliability information includes the following steps. A first adjustment value is determined according to the statistical characteristic of the first reliability information. The first reliability information is adjusted according to the first adjustment value to obtain the original reliability information.

Based on the above, the reliability information related to the first memory cells can be dynamically updated according to the first threshold voltage distribution of the first memory cells and the statistical characteristic of the first reliability information corresponding to the first threshold voltage distribution. The updated reliability information can improve the decoding performance of the data subsequently read from the first memory cells.

BRIEF DESCRIPTION OF THE DRAWINGS

FIG. 11 is a schematic diagram of a data table according to an exemplary embodiment of the disclosure.

DETAILED DESCRIPTION OF DISCLOSED EMBODIMENTS

Generally speaking, a memory storage device (also known as a memory storage system) includes a rewritable non-volatile memory module and a controller (also known as a control circuit). Usually, the memory storage device is used together with a host system, so that the host system may write data to the memory storage device or read data from the memory storage device.

Figure 1:
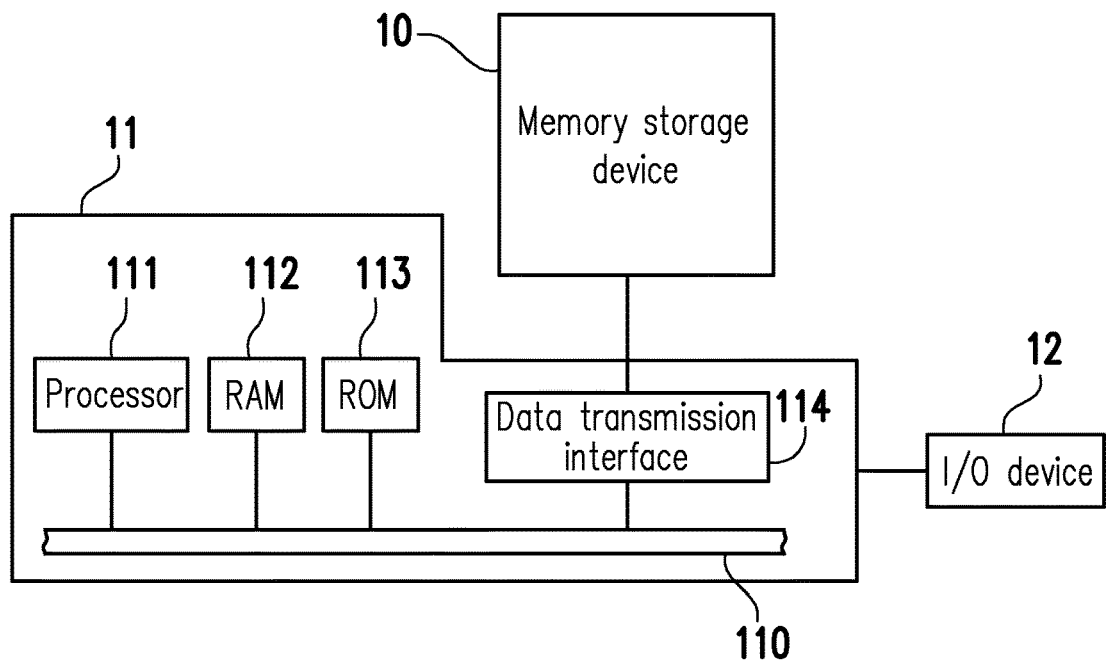
FIG. 1 is a schematic diagram of a host system, a memory storage device, and an input/output (I/O) device according to an exemplary embodiment of the disclosure.
Figure 2:
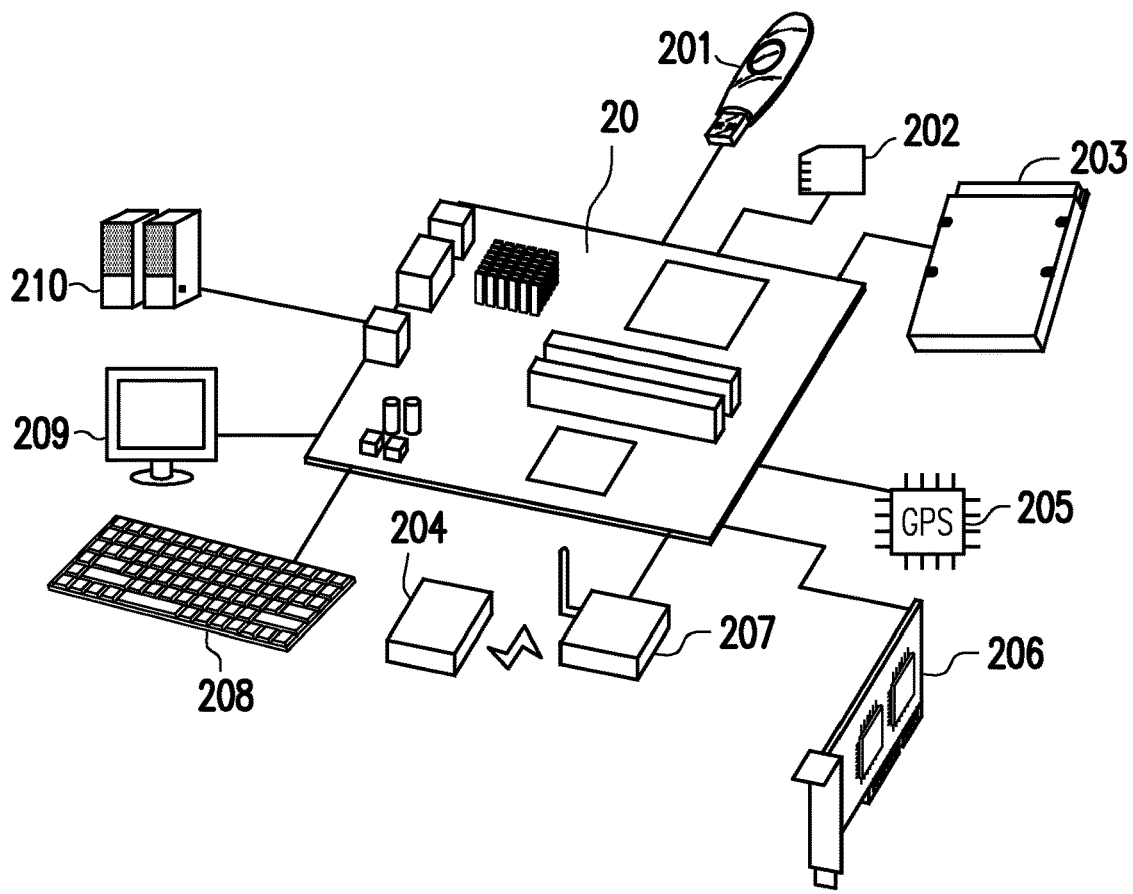
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

Please refer to FIG. 1 and FIG. 2. A host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In this exemplary embodiment, the host system 11 is coupled to the memory storage device 10 through the data transmission interface 114. For example, the host system 11 may store data into the memory storage device 10 or read data from the memory storage device 10 via the data transmission interface 114. In addition, the host system 11 is coupled to the I/O device 12 through the system bus 110. For example, the host system 11 may send an output signal to the I/O device 12 or receive an input signal from the I/O device 12 via the system bus 110.

In this exemplary embodiment, the processor 111, the random access memory 112, the read only memory 113, and the data transmission interface 114 may be disposed on a motherboard 20 of the host system 11. The number of data transmission interface 114 may be one or more. Through the data transmission interface 114, the motherboard 20 may be coupled to the memory storage device 10 via a wired or wireless manner. The memory storage device 10 may be, for example, a flash drive 201, a memory card 202, a solid state drive (SSD) 203, or a wireless memory storage device 204. The wireless memory storage device 204 may be, for example, a near field communication (NFC) memory storage device, a wireless fax (WiFi) memory storage device, a Bluetooth memory storage device, a low-power Bluetooth memory storage device (for example, iBeacon), or other memory storage devices based on various wireless communication technologies. In addition, the motherboard 20 may also be coupled to a global positioning system (GPS) module 205, a network interface card 206, a wireless transmission device 207, a keyboard 208, a screen 209, a speaker 210, or various other I/O devices through the system bus 110. For example, in an exemplary embodiment, the motherboard 20 may access the wireless memory storage device 204 through the wireless transmission device 207.

Figure 3:
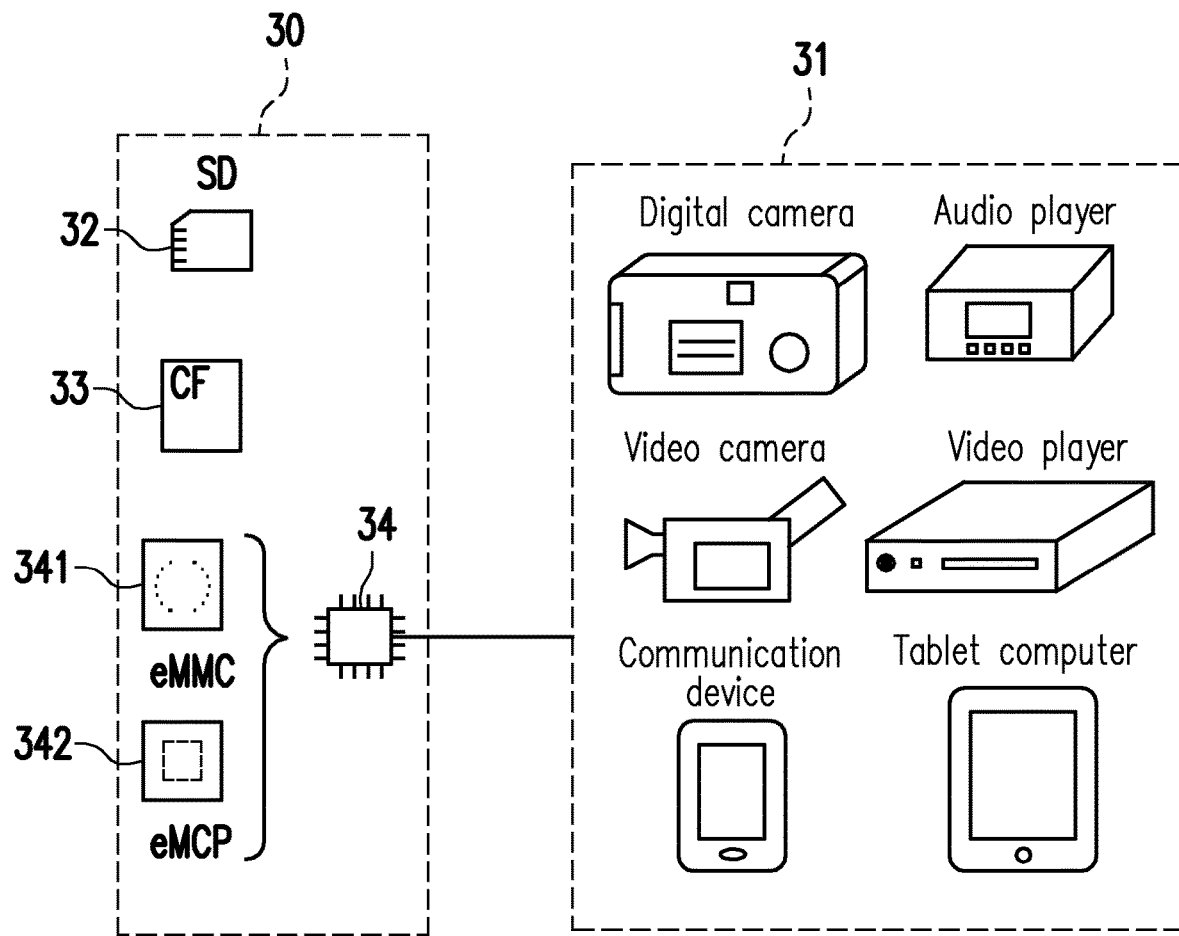
FIG. 3 is a schematic diagram of a host system and a memory storage device according to another exemplary embodiment of the disclosure.

In an exemplary embodiment, the host system is any system that may cooperate with a memory storage device to store data. Although in the above exemplary embodiments, the host system is described as a computer system, FIG. 3 is a schematic diagram of a host system and a memory storage device according to another exemplary embodiment of the disclosure. Please refer to FIG. 3. In another exemplary embodiment, a host system 31 may also be a digital camera, a video camera, a communication device, an audio player, a video player, a tablet computer, or other systems, and a memory storage device 30 may be a secure digital (SD) card 32, a compact flash (CF) card 33, an embedded storage device 34, or various other non-volatile memory storage devices used thereby. The embedded storage device 34 includes an embedded multi media card (eMMC) 341, an embedded multi chip package (eMCP) storage device 342, and/or various other embedded storage devices in which a memory module is directly coupled onto a substrate of a host system.

Figure 4:
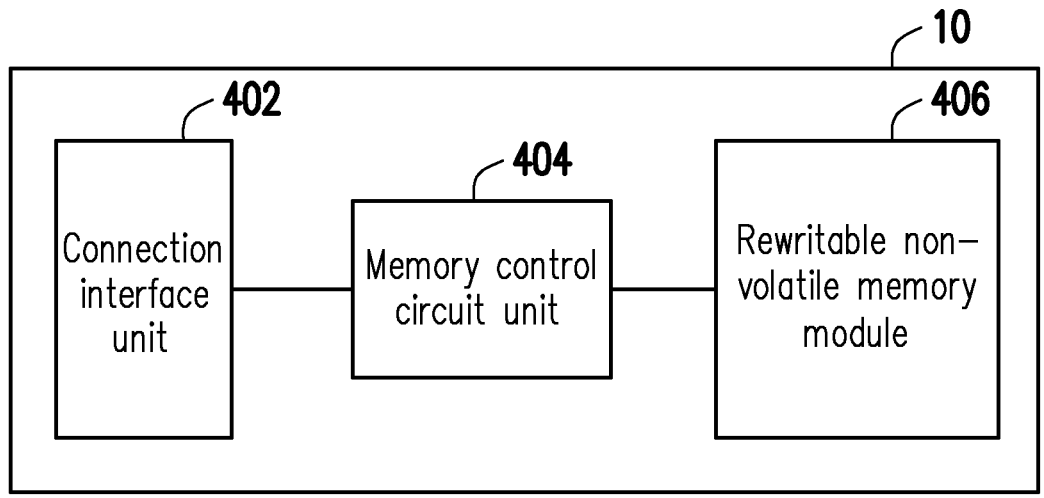
FIG. 4 is a schematic block diagram of a memory storage device according to an exemplary embodiment of the disclosure.

FIG. 4 is a schematic block diagram of a memory storage device according to an exemplary embodiment of the disclosure. Please refer to FIG. 4. The memory storage device 10 includes a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 through the connection interface unit 402. In this exemplary embodiment, the connection interface unit 402 is compatible with the serial advanced technology attachment (SATA) standard. However, it must be understood that the disclosure is not limited thereto. The connection interface unit 402 may also conform to the parallel advanced technology attachment (PATA) standard, the Institute of Electrical and Electronic Engineers (IEEE) 1394 standard, the high-speed peripheral component interconnect express (PCI express) standard, the universal serial bus (USB) standard, the SD interface standard, the ultra high speed-I (UHS-I) interface standard, the ultra high speed-II (UHS-II) interface standard, the memory stick (MS) interface standard, the multi chip package (MCP) interface standard, the multi media card (MMC) interface standard, the eMMC interface standard, the universal flash storage (UFS) interface standard, the eMCP interface standard, the CF interface standard, the integrated device electronics (IDE) standard, or other suitable standards. The connection interface unit 402 and the memory control circuit unit 404 may be packaged in a chip, or the connection interface unit 402 may be arranged outside a chip including the memory control circuit unit 404.

The memory control circuit unit 404 is configured to execute multiple logic gates or control commands implemented in the form of hardware or the form of firmware and perform operations such as data writing, reading, and erasing in the rewritable non-volatile memory module 406 according to a command of the host system 11.

The rewritable non-volatile memory module 406 is coupled to the memory control circuit unit 404 and is configured to store the data written by the host system 11. The rewritable non-volatile memory module 406 may be a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristic.

Each memory cell in the rewritable non-volatile memory module 406 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. This operation of changing the threshold voltage of the memory cell is also referred to as "writing data into the memory cell" or "programming the memory cell". As the threshold voltage changes, each memory cell in the rewritable non-volatile memory module 406 has multiple storage statuses. Through applying a read voltage, it is possible to judge which storage status a memory cell belongs to, thereby obtaining one or more bits stored in the memory cell.

In an exemplary embodiment, the memory cells of the rewritable non-volatile memory module 406 may constitute multiple physical programming units, and the physical programming units may constitute multiple physical erasing units. Specifically, the memory cells on the same word line or the same word line plane may form one or more physical programming units. If each memory cell may store more than 2 bits, the physical programming units on the same word line or the same word line plane may be classified into at least a lower physical programming unit and an upper physical programming unit. Generally speaking, the write speed of the lower physical programming unit may be greater than the write speed of the upper physical programming unit, and/or the reliability of the lower physical programming unit may be higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area contains multiple physical sectors for storing user data, and the redundancy bit area is configured to store system data (for example, management data such as an error correcting code). In this exemplary embodiment, the data bit area contains 32 physical sectors, and the size of one physical sector is 512 bytes (B). However, in other exemplary embodiments, the data bit area may also contain 8, 16, more, or less physical sectors, and the size of each physical sector may also be greater or smaller. On the other hand, the physical erasing unit is the smallest unit of erasure. That is, each physical erasing unit contains the smallest number of memory cells to be erased together. For example, the physical erasing unit is a physical block.

Figure 5:
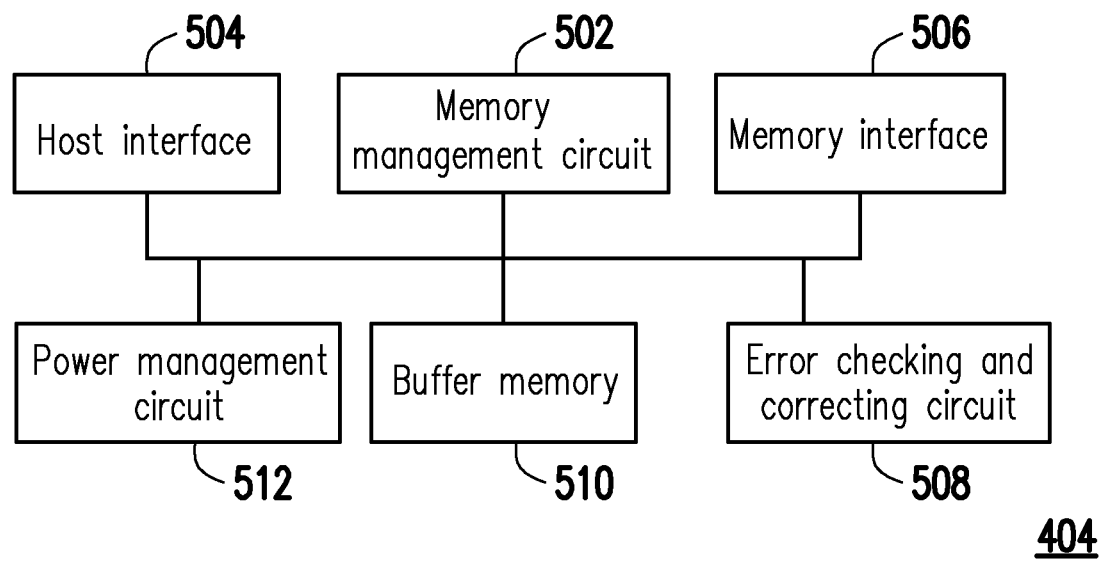
FIG. 5 is a schematic block diagram of a memory control circuit unit according to an exemplary embodiment of the disclosure.

FIG. 5 is a schematic block diagram of a memory control circuit unit according to an exemplary embodiment of the disclosure. Please refer to FIG. 5. A memory control circuit unit 404 includes a memory management circuit 502, a host interface 504, a memory interface 506, and an error detecting and correcting circuit 508.

The memory management circuit 502 is configured to control the overall operation of the memory control circuit unit 404. Specifically, the memory management circuit 502 has multiple control commands, and the control commands are executed to perform operations such as data writing, reading, and erasing when the memory storage device 10 is operating. The following description of the operation of the memory management circuit 502 is equivalent to the description of the operation of the memory control circuit unit 404.

In this exemplary embodiment, the control commands of the memory management circuit 502 are implemented in the form of firmware. For example, the memory management circuit 502 has a microprocessor unit (not shown) and a read only memory (not shown), and the control commands are burnt into the read only memory. When the memory storage device 10 is operating, the control commands are executed by the microprocessor unit to perform operations such as data writing, reading, and erasing.

In another exemplary embodiment, the control commands of the memory management circuit 502 may also be stored in a specific area (for example, a system area dedicated to storing system data in a memory module) of the rewritable non-volatile memory module 406 in the form of program codes. In addition, the memory management circuit 502 has a microprocessor unit (not shown), a read only memory (not shown), and a random access memory (not shown). In particular, the read only memory has a boot code, and the microprocessor unit first executes the boot code to load the control commands stored in the rewritable non-volatile memory module 406 into the random access memory of the memory management circuit 502 when the memory control circuit unit 404 is enabled. After that, the microprocessor unit runs the control commands to perform operations such as data writing, reading, and erasing.

In addition, in another exemplary embodiment, the control commands of the memory management circuit 502 may also be implemented in the form of hardware. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage a memory cell or a memory cell group of the rewritable non-volatile memory module 406. The memory write circuit is configured to issue a write command sequence to the rewritable non-volatile memory module 406 to write data into the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. The write command sequence, the read command sequence, and the erase command sequence may each include one or more program codes or command codes and are configured to instruct the rewritable non-volatile memory module 406 to execute corresponding operations such as writing, reading, and erasing. In an exemplary embodiment, the memory management circuit 502 may also issue other types of command sequences to the rewritable non-volatile memory module 406 to instruct to execute corresponding operations.

The host interface 504 is coupled to the memory management circuit 502. The memory management circuit 502 may communicate with the host system 11 through the host interface 504. The host interface 504 may be configured to receive and identify commands and data sent by the host system 11. For example, the commands and the data sent by the host system 11 may be sent to the memory management circuit 502 through the host interface 504. In addition, the memory management circuit 502 may send the data to the host system 11 through the host interface 504. In this exemplary embodiment, the host interface 504 is compatible with the SATA standard. However, it must be understood that the disclosure is not limited thereto. The host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and is configured to access the rewritable non-volatile memory module 406. That is to say, the data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 will send the corresponding command sequence. For example, the command sequences may include the write command sequence instructing to write data, the read command sequence instructing to read data, the erase command sequence instructing to erase data, and corresponding command sequences instructing various memory operations (for example, changing a read voltage level, executing a garbage collection operation, etc.). The command sequences are, for example, generated by the memory management circuit 502 and sent to the rewritable non-volatile memory module 406 through the memory interface 506. The command sequences may include one or more signals, or data on a bus. The signals or the data may include command codes or program codes. For example, the read command sequence includes information such as a read recognition code and a memory address.

The error detecting and correcting circuit 508 is coupled to the memory management circuit 502 and is configured to execute error detecting and correcting operations to ensure the correctness of the data. Specifically, when the memory management circuit 502 receives the write command from the host system 11, the error detecting and correcting circuit 508 generates a corresponding error correcting code (ECC) and/or error detecting code (EDC) for the data corresponding to the write command, and the memory management circuit 502 writes the data corresponding to the write command and the corresponding ECC and/or EDC into the rewritable non-volatile memory module 406. Later, when the memory management circuit 502 reads the data from the rewritable non-volatile memory module 406, the ECC and/or EDC corresponding to the data will also be simultaneously read, and the error detecting and correcting circuit 508 will execute the error detecting and correcting operations on the read data according to the ECC and/or the EDC.

In an exemplary embodiment, the memory control circuit unit 404 further includes a power management circuit 512 and a buffer memory 510. The power management circuit 512 is coupled to the memory management circuit 502 and is configured to control the power of the memory storage device 10. The buffer memory 510 is coupled to the memory management circuit 502 and is configured to temporarily store data and commands from the host system 11 or data from the rewritable non-volatile memory module 406.

In an exemplary embodiment, the rewritable non-volatile memory module 406 of FIG. 4 is also referred to as a flash memory module, the memory control circuit unit 404 is also referred to as a flash memory controller for controlling the flash memory module, and/or the memory management circuit 502 of FIG. 5 is also referred to as a flash memory management circuit.

In an exemplary embodiment, the memory management circuit 502 logically groups multiple physical units of the rewritable non-volatile memory module 406 into a storage area and a replacement area. The physical units in the storage area are configured to store data, and the physical units in the replacement area are configured to replace damaged physical units in the storage area. For example, if data read from a certain physical unit contains too many errors to be corrected, the physical unit may be regarded as a damaged physical unit. It should be noted that if there is no available physical unit in the replacement area, the memory management circuit 502 may declare the entire memory storage device 10 as a write protect status, and no more data can be written.

In an exemplary embodiment, each physical unit refers to a physical erasing unit. However, in another exemplary embodiment, a physical unit may also refer to a physical address, a physical programming unit, or consist of multiple continuous or discontinuous physical addresses. The memory management circuit 502 may configure multiple logic units to map the physical units in the storage area. In this exemplary embodiment, each logic unit refers to a logic address. However, in another exemplary embodiment, a logic unit may also refer to a logic programming unit, a logic erasing unit, or consist of multiple continuous or discontinuous logic addresses. In addition, each of the logic units may be mapped to one or more physical units.

In an exemplary embodiment, the memory management circuit 502 may record a mapping relationship between the logic unit and the physical unit (also referred to as the logical-to-physical address mapping relationship) in at least one logical-to-physical address mapping table. When the host system 11 intends to read data from the memory storage device 10 or write data into the memory storage device 10, the memory management circuit 502 may execute a data access operation on the memory storage device 10 according to the logical-to-physical address mapping table.

In an exemplary embodiment, the error detecting and correcting circuit 508 supports low-density parity-check (LDPC) codes. For example, the error detecting and correcting circuit 508 may use LDPC codes for encoding and decoding. However, in another exemplary embodiment, the error detecting and correcting circuit 508 may also support Bose-Chaudhuri-Hocquenghem (BCH) codes, convolutional codes, turbo codes, etc., which is not limited by the disclosure.

In low-density parity-check correction codes, a parity check matrix is used to define valid codewords. In the following, the parity check matrix is labelled as a matrix H, and a codeword is labelled as CW. According to the following Equation (1), if the multiplication of the parity check matrix H and the codeword CW is a zero vector, it represents that the codeword CW is a valid codeword. An operator $\otimes$ represents modulo-2 matrix multiplication. In other words, the null space of the matrix H contains all valid codewords. However, the disclosure does not limit the content of the codeword CW. For example, the codeword CW may also include an ECC or an EDC generated by any algorithm.

$$H \otimes CW^T = 0 \quad (1)$$

In Equation (1), the dimension of the matrix H is k-by-n, and the dimension of the codeword CW is 1-by-n, where k and n are positive integers. The codeword CW includes message bits and parity bits, that is, the codeword CW may be represented as [M P]. A vector M is composed of message bits, and a vector P is composed of parity bits. The dimension of the vector M is 1-by-(n−k), and the dimension of the vector P is 1-by-k. Hereinafter, the message bits and the parity bits are collectively referred to as data bits. In other words, the codeword CW has n data bits, where the length of the message bits is (n−k) bits, and the length of the parity bits is k bits. In addition, the code rate of the codeword CW is (n−k)/n.

When encoding, a generator matrix (hereinafter labeled as G) may be used, so that any vector M satisfies the following Equation (2). The dimension of the generator matrix G is (n−k)-by-n.

$$M \otimes G = [MP] = CW \quad (2)$$

The codeword CW generated by Equation (2) is a valid codeword. Therefore, Equation (2) may be substituted into Equation (1), thereby obtaining the following Equation (3).

$$H \otimes G^T \otimes M^T = 0 \quad (3)$$

Since the vector M may be any vector, the following Equation (4) must be satisfied. In other words, after determining the parity check matrix H, the corresponding generator matrix G may also be determined.

$$H \otimes G^T = 0 \quad (4)$$

When decoding the codeword CW, a parity check operation is first performed on the data bits in the codeword. For example, in the parity check operation, the parity check matrix H may be multiplied by the codeword CW to generate a vector (hereinafter labeled as S, as shown in the following Equation (5)). If the vector S is a zero vector, the codeword CW may be directly output. If the vector S is not a zero vector, it represents that the codeword CW is not a valid codeword.

$$H \otimes CW^T = S \qquad (5)$$

In Equation (5), the dimension of the vector S is k-by-1. Each element in the vector S is also referred to as a syndrome. If the codeword CW is not a valid codeword, the error detecting and correcting circuit 508 decodes the codeword CW to try to correct any error bit in the codeword CW.

Figures 6, 7:
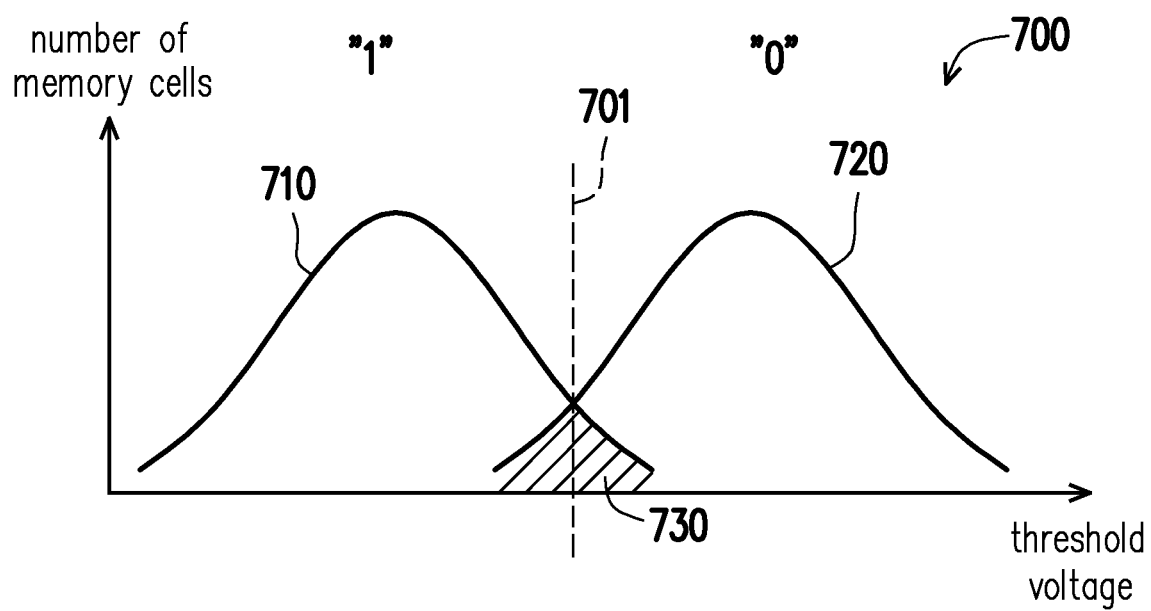
FIG. 6 is a schematic diagram of a parity check matrix according to an exemplary embodiment of the disclosure.
FIG. 7 is a schematic diagram of a threshold voltage distribution of memory cells according to an exemplary embodiment of the disclosure.

FIG. 6 is a schematic diagram of a parity check matrix according to an exemplary embodiment of the disclosure. Please refer to FIG. 6. The dimension of a parity check matrix 600 is k-by-n. For example, k is 8, and n is 9. However, the disclosure does not limit the values of the positive integers k and n.

Each row of the parity check matrix 600 also represents a constraint. Taking a first row of the parity check matrix 600 as an example, if a certain codeword is a valid codeword, after modulo-2 addition is performed on the 3-rd, 5-th, 8-th, and 9-th bits in the codeword, bit "0" is obtained. Persons skilled in the art should be able to understand how to use the parity check matrix 600 to encode and decode, so there will be no reiteration here. In addition, the parity check matrix 600 is only an exemplary matrix, and is not intended to limit the disclosure.

When the memory management circuit 502 intends to store multiple bits into the rewritable non-volatile memory module 406, the error detecting and correcting circuit 508 may generate k corresponding parity bits for every (n–k) bits (that is, message bits). Next, the memory management circuit 502 may write n bits (that is, data bits) as a codeword into the rewritable non-volatile memory module 406.

FIG. 7 is a schematic diagram of a threshold voltage distribution of memory cells according to an exemplary embodiment of the disclosure. Please refer to FIG. 7. The horizontal axis represents a threshold voltage of the memory cells, and the vertical axis represents the number of memory cells. For example, a distribution 700 in FIG. 7 may represent the threshold voltage distribution of multiple memory cells (also referred to as first memory cells) in a physical programming unit. The distribution 700 includes statuses 710 and 720.

In an exemplary embodiment, assuming that the status 710 corresponds to bit "1" and the status 720 corresponds to bit "0", when the threshold voltage of a certain memory cell belongs to the status 710, the memory cell stores bit "1"; and conversely, if the threshold voltage of a certain memory cell belongs to the status 720, the memory cell stores bit "0". It should be noted that in this exemplary embodiment, one status in the threshold voltage distribution corresponds to one bit value, and there are two possible statuses for the threshold voltage distribution of the memory cells. However, in other exemplary embodiments, each status in the threshold voltage distribution may also correspond to multiple bit values, and the threshold voltage distribution of the memory cells may also have four, eight, or any other statuses. In addition, the disclosure does not limit the bit represented by each status. For example, in another exemplary embodiment of FIG. 7, the status 710 may also correspond to bit "0", and the status 720 may correspond to bit "1".

In an exemplary embodiment, when data is to be read from the rewritable non-volatile memory module 406, the memory management circuit 202 sends a read command sequence to the rewritable non-volatile memory module 406. The read command sequence is configured to instruct the rewritable non-volatile memory module 406 to read the first memory cells using at least one read voltage level to obtain the data stored in the first memory cells. For example, according to the read command sequence, the rewritable non-volatile memory module 406 may read the first memory cells using a read voltage level 701 in FIG. 7. If the threshold voltage of a certain one of the first memory cells is less than the read voltage level 701, the memory cell may be conducted, and the memory management circuit 502 may read bit "1". Alternatively, if the threshold voltage of a certain one of the first memory cells is greater than the read voltage level 701, the memory cell may not be conducted, and the memory management circuit 502 may read bit "0". The read bit data may form one or more codewords.

In an exemplary embodiment, an overlap area 730 is included between the status 710 and the status 720. The overlap area 730 represents that some memory cells in the first memory cells should store bit "1" (belonging to the status 710), but the threshold voltage thereof is greater than the applied read voltage level 701; and also, some memory cells in the first memory cells should store bit "0" (belonging to the status 720), but the threshold voltage thereof is less than the applied read voltage level 701. In other words, some bits in the data read by applying the read voltage level 701 have errors.

Generally speaking, if the usage time of the first memory cells is very short (for example, the storage time of the data in the first memory cells is not long) and/or the usage frequency of the first memory cells is very low (for example, the read count, the write count, and/or the erasure count of the first memory cells are not high), the area of the overlap area 730 is usually very small, and there may even be no overlap area 730 (that is, the statuses 710 and 720 do not overlap). Alternatively, if the memory storage device 10 has just left the factory, the overlap area 730 usually does not exist. If the area of the overlap area 730 is small, the data read from the first memory cells by applying the read voltage level 701 often has fewer error bits.

However, as the usage time and/or the usage frequency of the rewritable non-volatile memory module 406 increases, the area of the overlap area 730 may gradually increase. For example, if the usage time of the first memory cells is very long (for example, the data is stored in the first memory cells for a long time) and/or the usage frequency of the first memory cells is very high (for example, the read count, the write count, and/or the erasure count of the first memory cells are very high), the area of the overlap area 730 may become larger (for example, the status 710 and 720 will change flat and/or the status 710 and 720 will be closer to each other). If the area of the overlap area 730 is large, there may be more error bits in the data read from the first memory cells by applying the read voltage level 701. Therefore, after receiving the data read from the rewritable non-volatile memory module 406, the error detecting and correcting circuit 508 may execute a parity check operation to verify whether there is any error in the data. If it is determined that there is an error in the data, the error detecting and correcting circuit 508 may execute a decoding operation to correct the error.

In an exemplary embodiment, the error detecting and correcting circuit 508 may execute an iterative decoding operation. The iterative decoding operation is configured to decode a piece of data from the rewritable non-volatile memory module 406. For example, one decoding unit in the data may be one codeword. During the iterative decoding operation, the parity check operation for checking the correctness of the data and the decoding operation for correcting the error in the data may be repeated and alternately executed until the successful decoding or the number of iterations reaches a predetermined number. If the number of iterations reaches the predetermined number, it represents that decoding has failed, and the error detecting and correcting circuit 508 may stop decoding. In addition, if the parity check operation determines that there is no error in a certain piece of data, the error detecting and correcting circuit 508 may stop decoding and output the successfully decoded data.

Figure 8:
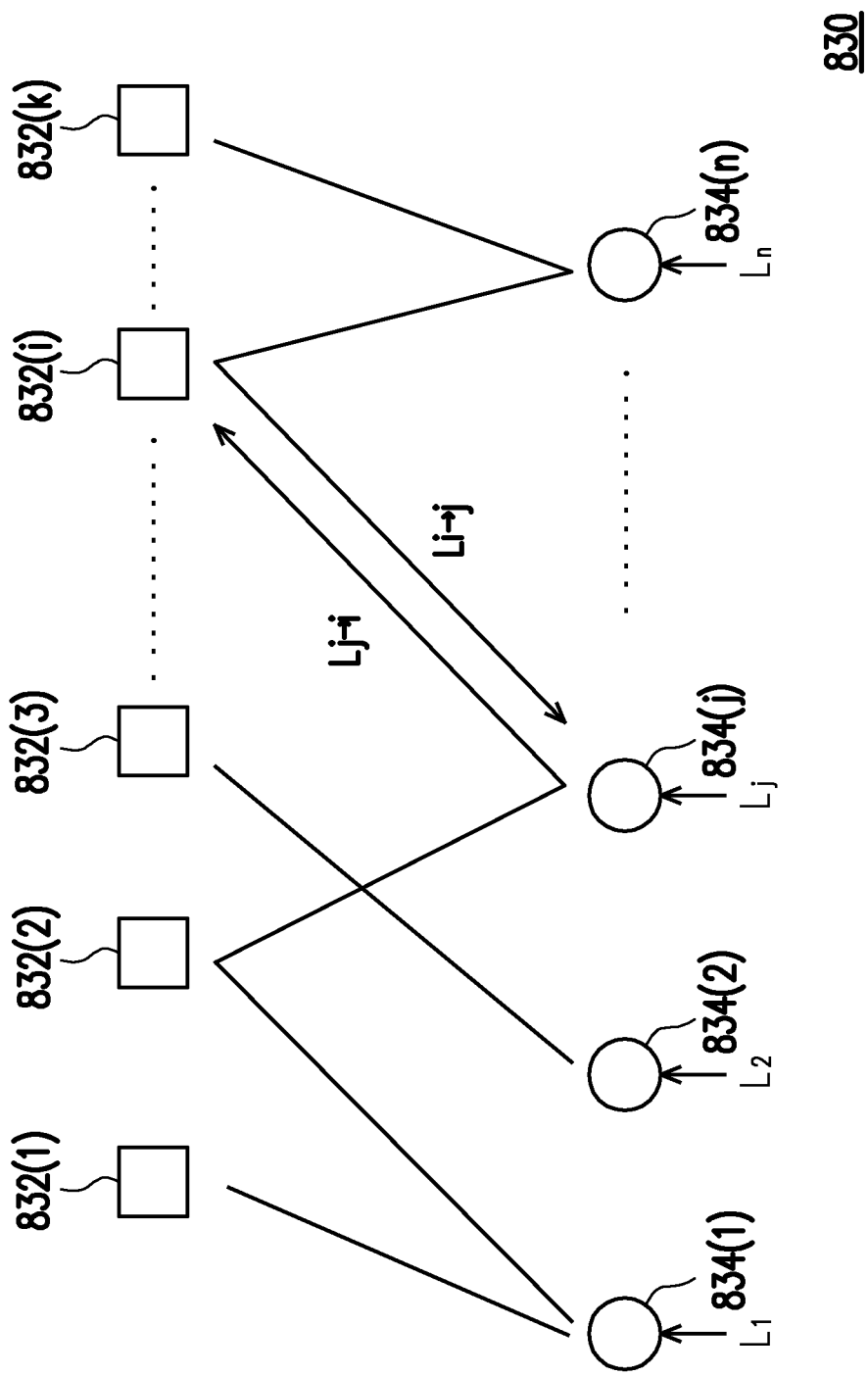
FIG. 8 is a schematic diagram of a bipartite graph according to an exemplary embodiment of the disclosure.

FIG. 8 is a schematic diagram of a bipartite graph according to an exemplary embodiment of the disclosure. Please refer to FIG. 8. Generally speaking, the parity check matrix H may be represented by a bipartite graph 830, which includes parity nodes 832(1) to 832($k$) and message nodes 834(1) to 834($n$). Each of the parity nodes 832(1) to 832($k$) corresponds to a syndrome, and each of the message nodes 834(1) to 834($n$) corresponds to a data bit. The correspondence between the data bits and the syndromes (that is, the connection between the message nodes 834(1) to 834($n$) and the parity nodes 832(1) to 832($k$)) is generated according to the parity check matrix H. Specifically, if an element of the i-th row and the j-th column in the parity check matrix H is 1, the i-th parity node 832($i$) will be connected to the j-th message node 834($j$), where i and j are positive integers.

When the memory management circuit 502 reads n data bits (to form a codeword) from the rewritable non-volatile memory module 406, the memory management circuit 502 also obtains the reliability information (also referred to as the channel reliability information) of each data bit. The reliability information is configured to represent the probability (also referred to as the confidence) that the corresponding data bit is decoded into bit "1" or "0". In the bipartite graph 830, the message nodes 834(1) to 834($n$) also receive the corresponding reliability information. For example, the message node 834(1) receives reliability information $L_1$ of the 1-st data bit, and the message node 834($j$) receives reliability information $L_1$ of the j-th data bit.

The error detecting and correcting circuit 508 may execute the decoding operation according to the structure of the bipartite graph 830 and the reliability information $L_1$ to $L_n$. For example, the decoding operation includes iterative decoding. During iterative decoding, the message nodes 834(1) to 834($n$) calculates the reliability information for the parity nodes 832(1) to 832($k$), and the parity nodes 832(1) to 832($k$) also calculates the reliability information for the message nodes 834(1) to 834($n$). The reliability information is sent along the edges in the bipartite graph 830. For example, the parity node 832($i$) sends reliability information $L_{i \rightarrow j}$ to the message node 834($j$), and the message node 834($j$) sends reliability information $L_{j \rightarrow i}$ to the parity node 832($i$). The reliability information is configured to represent the probability (that is, the confidence) that a node deems that a certain data bit is decoded as "1" or "0". For example, the reliability information $L_{j \rightarrow i}$ represents the confidence (may be positive or negative) that the message node 834($j$) deems that the j-th data bit is decoded as "1" or "0", and the reliability information $L_{i \rightarrow j}$ represents the confidence that the parity node 832($i$) deems that the j-th data bit is decoded as "1" or "0". In addition, the message nodes 834(1) to 834($n$) and the parity nodes 832(1) to 832($k$) may calculate the output reliability information according to the input reliability information, which is similar to calculating the conditional probability that a data bit is decoded as "1" or "0". Therefore, the above process of sending the reliability information is also referred to as belief propagation.

After executing the parity check operation (for example, multiplying the codeword formed by the data bits by the parity check matrix) on the calculated data bits, it may be judged whether the codeword is a valid codeword. If the generated codeword is a valid codeword, it represents that decoding is successful and iterative decoding will stop. However, if the generated codeword is not a valid codeword, the next iteration will be performed. If the number of iterations of iterative decoding reaches a predetermined value, it represents that decoding has failed and iterative decoding will also stop.

In an exemplary embodiment, the reliability information includes log likelihood ratio (LLR). For example, the reliability information $L_1$ to $L_n$, $L_{j \rightarrow i}$ and $L_{j \rightarrow i}$ in FIG. 8 may respectively be an LLR. Generally speaking, the larger the absolute value of the LLR (which may be positive or negative) corresponding to a certain data bit, the higher the reliability of the data bit, so the higher the probability that the current bit value of the data bit is regarded to be correct. Conversely, the smaller the absolute value of the LLR corresponding to a certain data bit, the lower the reliability of the data bit, so the higher the probability that the current bit value of the data bit is regarded to be wrong and may be corrected during the current iterative decoding.

In an exemplary embodiment, the reliability information (for example, the LLR) used during iterative decoding is obtained by looking up a table. However, in another exemplary embodiment, the reliability information used during iterative decoding may also be dynamically calculated and generated according to a specific algorithm during iterative decoding. In addition, based on different algorithms, the message nodes 834(1) to 834($n$) and/or the parity nodes 832(1) to 832($k$) may also calculate different types of reliability information, which is not limited to the LLR.

Figure 9:
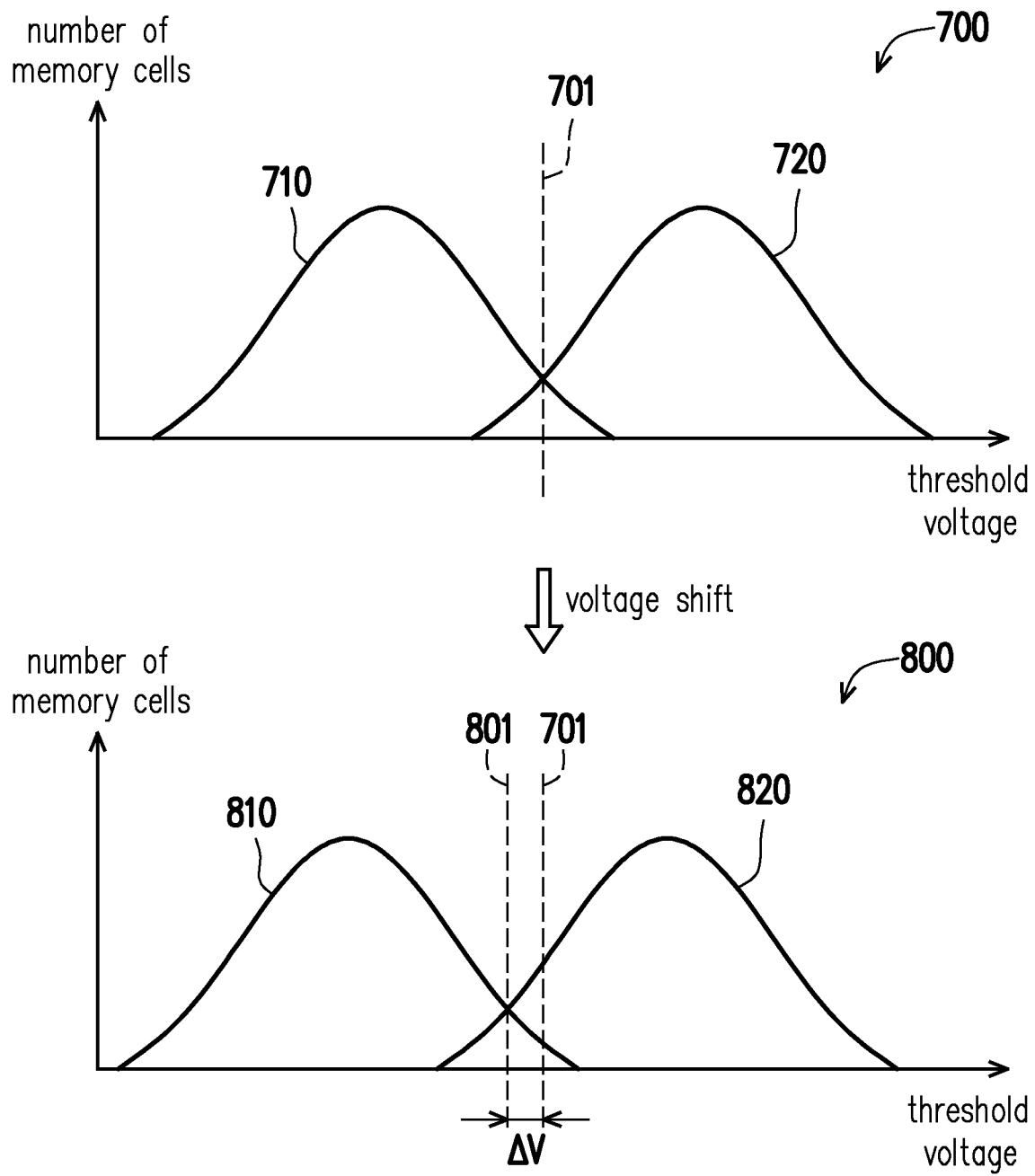
FIG. 9 is a schematic diagram of a threshold voltage distribution of memory cells according to an exemplary embodiment of the disclosure.

FIG. 9 is a schematic diagram of a threshold voltage distribution of memory cells according to an exemplary embodiment of the disclosure. Please refer to FIG. 9, which is continued from the exemplary embodiment of FIG. 7. In an exemplary embodiment, the threshold voltage of at least some memory cells in the statuses 710 and/or 720 may also have a voltage shift. For example, statuses 810 and 820 in a distribution 800 may be respectively configured to represent the statuses 710 and 720 after the voltage shift. There are many reasons for the voltage shift, which includes increase in the usage time, the read count, the write count, the erasure count, and/or excessive change in the temperature, etc. of the rewritable non-volatile memory module 406.

In an exemplary embodiment, before the voltage shift, the read voltage level 701 may be regarded as the optimal read voltage corresponding to the distribution 700. For example, the read voltage level 701 may be located in the middle position of the statuses 710 and 720. Therefore, for the first memory cells with the threshold voltage distribution shown in the distribution 700, relatively correct bit data may be read by reading the first memory cells using the read voltage level 701.

However, after the voltage shift, the threshold voltage distribution of the first memory cells changes as shown in the distribution 800. At this time, the position of the read voltage level 701 has shifted from the middle position of the statuses 810 and 820. Therefore, the read voltage level 701 may not be regarded as the optimal read voltage corresponding to the distribution 800. With respect to the read voltage level 701, a read voltage level 801 may be regarded as the optimal read voltage corresponding to the distribution 800. For example, the read voltage level 801 may be located in the middle position of the statuses 810 and 820. Therefore, for the first memory cells with the threshold voltage distribution shown in the distribution 800, with respect to the read voltage level 701, relatively correct bit data may be read by reading the first memory cells using the read voltage level 801.

In an exemplary embodiment, there may be a voltage difference ΔV between the read voltage levels 701 and 801. In an exemplary embodiment, the voltage difference ΔV may correspond to a shift voltage between the read voltage levels 701 and 801. In an exemplary embodiment, the voltage difference ΔV may correspond to or reflect a shift amount between the distributions 700 and 800. In an exemplary embodiment, the voltage difference ΔV may be positively correlated with the shift amount between the distributions 700 and 800. For example, the larger the voltage difference ΔV, the larger the shift amount between the distributions 700 and 800.

In an exemplary embodiment, for the first memory cells with the distribution 700, after reading the data from the first memory cells using the read voltage level 701, the error detecting and correcting circuit 508 may decode the data according to predetermined reliability information. In particular, the read voltage level 701 may be regarded as the optimal read voltage corresponding to the distribution 700. Therefore, after reading the data from the first memory cells using the read voltage level 701, the probability that the error detecting and correcting circuit 508 may successfully decode the data according to the predetermined reliability information is very high. However, for the first memory cells with the distribution 800, after reading the data from the first memory cells using the read voltage level 701 (or 801), if the error detecting and correcting circuit 508 continues to use the predetermined reliability information to decode the data, the probability that the error detecting and correcting circuit 508 successfully decodes the data decreases (because the threshold voltage distribution of the first memory cells is shifted).

In an exemplary embodiment, after the voltage shift, the memory management circuit 502 may dynamically update reliability information related to the first memory cells according to the current threshold voltage distribution (for example, the distribution 800) of the first memory cells. The updated reliability information may increase the decoding success rate of the data read from the first memory cells after the voltage shift.

In an exemplary embodiment, the memory management circuit 502 may send a read command sequence to the rewritable non-volatile memory module 406. The read command sequence may instruct the rewritable non-volatile memory module 406 to read the first memory cells using multiple read voltage levels, so as to obtain the threshold voltage distribution (also referred to as a first threshold voltage distribution) of the first memory cells. The memory management circuit 502 may obtain shift information of the first threshold voltage distribution with respect to an original threshold voltage distribution of the first memory cells. For example, the shift information may reflect a shift amount between the first threshold voltage distribution and the original threshold voltage distribution of the first memory cells.

In an exemplary embodiment, the memory management circuit 502 may obtain reliability information (also referred to as first reliability information) corresponding to the first threshold voltage distribution. The memory management circuit 502 may recover reliability information (also referred to as original reliability information) corresponding to the original threshold voltage distribution according to a statistical characteristic of the first reliability information. The memory management circuit 502 may adjust the original reliability information according to the shift information to obtain another reliability information (also referred to as second reliability information) corresponding to the first threshold voltage distribution. The second reliability information is different from the first reliability information.

Then, the memory management circuit 502 may update reliability information related to the first memory cells according to the second reliability information. For convenience of description, in the following exemplary embodiments, the distributions 700 and 800 are respectively used as examples of the original threshold voltage distribution and the first threshold voltage distribution of the first memory cells.

Figure 10:
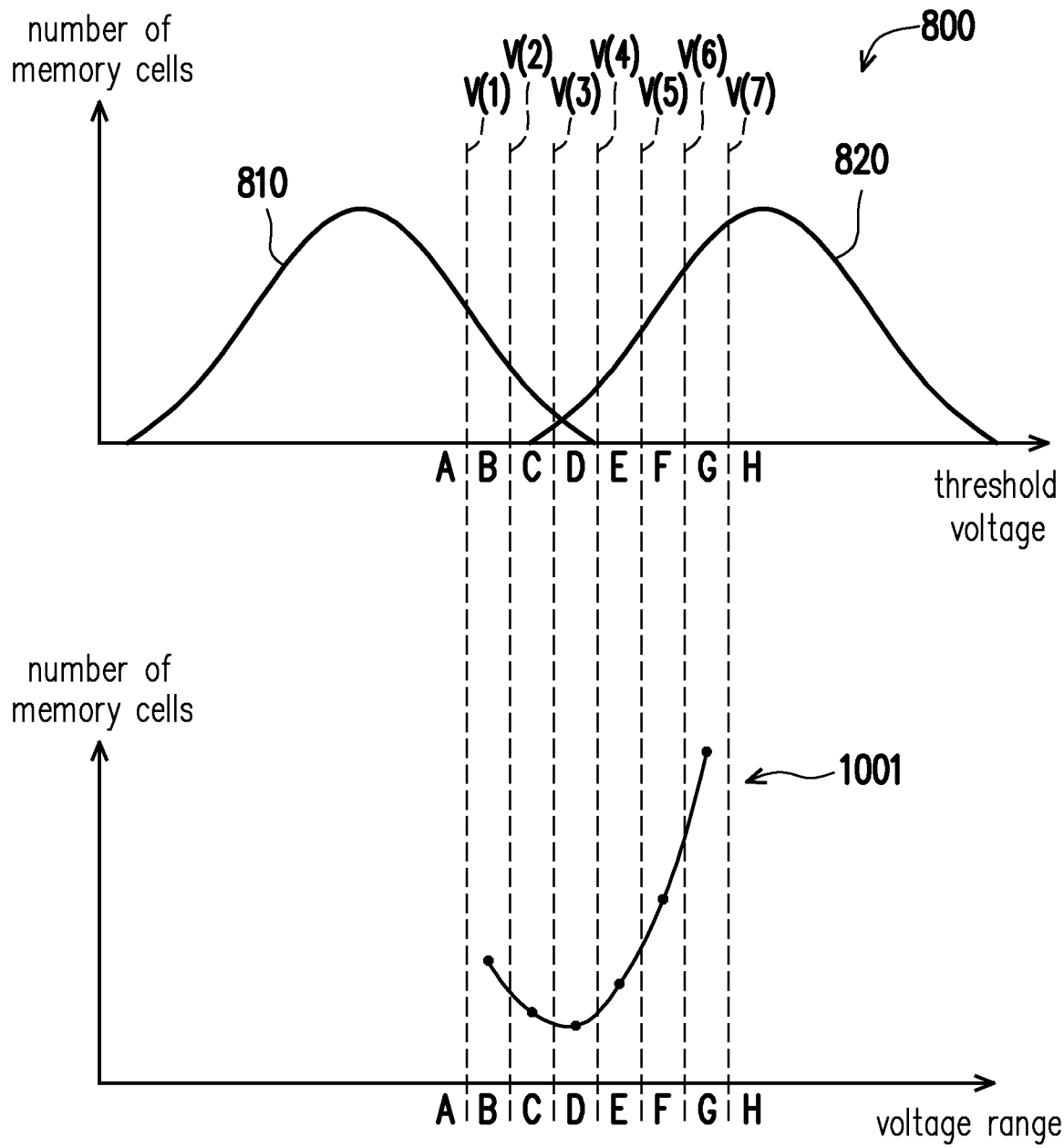
FIG. 10 is a schematic diagram of a threshold voltage distribution of memory cells according to an exemplary embodiment of the disclosure.

FIG. 10 is a schematic diagram of a threshold voltage distribution of memory cells according to an exemplary embodiment of the disclosure. Please refer to FIG. 10. Under the status where the first memory cells have the threshold voltage distribution as shown in the distribution 800, the memory management circuit 502 may read the first memory cells using multiple read voltage levels V(1) to V(7). The total number of the read voltage levels V(1) to V(7) may be adjusted according to practical requirements, which is not limited by the disclosure.

It should be noted that the read voltage levels V(1) to V(7) may be configured to divide the distribution 800 into multiple voltage ranges A to H. For example, voltages in the voltage range A are all less than the read voltage level V(1), and voltages in the voltage range B are between the read voltage levels V(1) and V(2), and so on. According to a read result of reading the first memory cells using the read voltage levels V(1) to V(7), the threshold voltage of each memory cell in the first memory cells may be identified as belonging to a certain voltage range in the voltage ranges A to H.

In an exemplary embodiment, the read voltage levels V(1)-V(7) are also referred to as soft read voltage levels. In an exemplary embodiment, the read result of reading a certain memory cell in the first memory cells using the read voltage levels V(1) to V(7) contains multiple soft bits. According to the soft bits, the threshold voltage of the memory cell may be identified as belonging to a certain voltage range in the voltage ranges A to H.

In an exemplary embodiment, the memory management circuit 502 may read the read result of the first memory cells according to the read voltage levels V(1) to V(7), and count the total number of memory cells whose threshold voltages are located within at least some voltage ranges in the voltage ranges A to H. In the following exemplary embodiments, it is assumed that the statistical result reflects that the total number of memory cells whose threshold voltages are located in the voltage ranges B to G are respectively "820", "357", "260", "826", "2550", and "4759". In other words, taking the voltage range B as an example, in the first memory cells, the total number of memory cells whose current threshold voltage are located in the voltage range B is 820.

In an exemplary embodiment, the memory management circuit 502 may determine a distribution curve 1001 according to the total number of counted memory cells within the voltage ranges A to H (or B to G). The distribution curve 1001 may reflect the distribution condition of the threshold voltages of the memory cells in the voltage ranges A to H (or B to G). In other words, the distribution curve 1001 may reflect a memory cell number distribution presented based on the voltage ranges A to H (or B to G). In an exemplary embodiment, the distribution curve 1001 may also be configured to (schematically) describe or reflect the first threshold voltage distribution of the first memory cells.

In an exemplary embodiment, the memory management circuit 502 may obtain the shift information of the first threshold voltage with respect to the original threshold voltage distribution of the first memory cells according to information (that is, the memory cell number distribution within the voltage ranges A to H (or B to G)) along with the distribution curve 1001. For example, the shift information may be represented by the shift amount between the first threshold voltage distribution and the original threshold voltage distribution, and the shift amount may be positively correlated with the voltage difference $\Delta V$ of FIG. 9.

In an exemplary embodiment, the memory management circuit 502 may obtain the shift information according to the total number of memory cells corresponding to a certain voltage range in the voltage ranges A to H (or B to G). For example, the memory management circuit 502 may determine the shift information according to the total number of memory cells corresponding to a specific voltage range in the voltage ranges A to H (or B to G) and a predetermined number corresponding to the specific voltage range. It should be noted that the predetermined number may be configured to represent the total number of memory cells whose threshold voltages belong to the specific voltage range in the original threshold voltage distribution of the first memory cells.

Taking the voltage range D as an example, the memory management circuit 502 may determine the shift information according to a difference between the total number of currently counted memory cells corresponding to the voltage range D and the predetermined number corresponding to the voltage range D. In other words, the difference may reflect the shift amount between the first threshold voltage distribution and the original threshold voltage distribution. The larger the difference, the larger the shift amount between the first threshold voltage distribution and the original threshold voltage distribution.

In an exemplary embodiment, the memory management circuit 502 determines the specific voltage range (for example, the voltage range D) using a low point position (or a lowest point position) of the distribution curve 1001. However, in an exemplary embodiment, the specific voltage range may also be other voltage ranges in the voltage ranges A to H (or B to G), which is not limited by the disclosure.

In an exemplary embodiment, the memory management circuit 502 may determine the shift information according to a characteristic parameter of the distribution curve 1001. For example, the characteristic parameter may include one of a slope value and the low point position of the distribution curve 1001. In an exemplary embodiment, the characteristic parameter may also include any parameter that may be configured to describe the slope value, the low point position, or other curve characteristics of the distribution curve 1001, which is not limited by the disclosure.

In an exemplary embodiment, the memory management circuit 502 may determine the shift information according to a difference between a certain characteristic parameter of the distribution curve 1001 and a predetermined value. Taking the slope value as an example, the memory management circuit 502 may determine the shift information according to the difference between the slope value of the distribution curve 1001 within a specific voltage range and a predetermined slope value corresponding to the specific voltage range. Alternatively, taking the low point position as an example, the memory management circuit 502 may determine the shift information according to the difference between the low point position of the distribution curve 1001 and a predetermined low point position. For example, the difference between the low point position of the distribution curve 1001 and the predetermined low point position may be positively correlated with the voltage difference $\Delta V$ of FIG. 9.

In an exemplary embodiment, the memory management circuit 502 may obtain the first reliability information corresponding to the first threshold voltage distribution according to the memory cell number distribution. For example, the memory management circuit 502 may respectively substitute the total numbers "820", "357", "260", "826", "2550", and "4759" into an equation, and obtain that the first reliability information corresponding to the voltage ranges B to G are respectively "−12", "−6", "4", "5", "10", and "16" according to the output of the equation.

In an exemplary embodiment, the memory management circuit 502 may recover the original reliability information corresponding to the original threshold voltage distribution according to the statistical characteristic of the first reliability information. For example, the statistical characteristic may reflect a difference (for example, "28") between the first reliability information (for example, "−12") corresponding to the voltage range B and the first reliability information (for example, "16") corresponding to the voltage range G. According to the difference, the memory management circuit 502 may recover the original reliability information (for example, "−14" and "14") respectively corresponding to the voltage ranges B and G, and the original reliability information corresponding to the remaining voltage ranges when the first memory cells have the original threshold voltage distribution.

In an exemplary embodiment, the memory management circuit 502 may determine an adjustment value according to the statistical characteristic of the first reliability information. The memory management circuit 502 may adjust the first reliability information according to the adjustment value to obtain the original reliability information. In an exemplary embodiment, according to the difference (for example, "28") between the first reliability information (for example, "−12") corresponding to the voltage range B and the first reliability information (for example, "16") corresponding to the voltage range G, the memory management circuit 502 may determine the adjustment value. For example, according to the difference (for example, "28"), the memory management circuit 502 may first determine the original reliability information (for example, "−14" and "14") respectively corresponding to the voltage ranges B and G. Then, the memory management circuit 502 may determine the adjustment value (for example, "2") according to the difference (for example, "2") between the first reliability information (for example, "−12") corresponding to the voltage range B and the original reliability information (for example, "−14") corresponding to the voltage range B. For example, after determining the adjustment value (for example, "2"), the memory management circuit 502 may subtract the adjustment value from each value in the first reliability information, thereby obtaining that the original reliability information corresponding to the voltage ranges B to G are respectively "−14", "−8", "−3", "3", "8", and "14".

In an exemplary embodiment, the memory management circuit 502 may adjust the original reliability information according to the shift information to obtain new reliability information (that is, the second reliability information) corresponding to the first threshold voltage distribution. For example, assuming that the shift information includes a shift amount ΔS (for example, "3"), the memory management circuit 502 may add the shift amount ΔS to the original reliability information (for example, "−14", "−8", "−3, "3", "8", and "14") respectively corresponding to the voltage ranges B to G to obtain the second reliability information (for example, "−11", "−5", "0", "6", "13", and "17") respectively corresponding to the voltage ranges B to G. The shift amount ΔS may be positively correlated with the voltage difference ΔV of FIG. 9.

In an exemplary embodiment, the memory management circuit 502 may update the reliability information related to the first memory cells according to the second reliability information. For example, the memory management circuit 502 may use the second reliability information to replace the reliability information related to the first memory cells. Later, under the status where the first memory cells have the first threshold voltage distribution, using the second reliability information to decode the data read from the first memory cells has a higher decoding efficiency. In an exemplary embodiment, the second reliability information may also be configured to update the reliability information related to the remaining memory cells (that is, memory cells other than the first memory cells).

FIG. 11 is a schematic diagram of a data table according to an exemplary embodiment of the disclosure. Please refer to FIG. 11. In an exemplary embodiment, the memory management circuit 502 may record temporary information used during the process of updating the reliability information in a data table 1101. Taking the update of the reliability information corresponding to the voltage ranges B to G of FIG. 10 as an example, according to the data table 1101, the total number of memory cells whose threshold voltages are located in the voltage ranges B to G are respectively "820", "357", "260", "826", "2550", and "4759". According to the total numbers, first reliability information LLR(1) corresponding to the voltage ranges B to G may be respectively determined as "−12", "−6", "4", "5", "10", and "16". According to the statistical characteristic of the first reliability information LLR(1), original reliability information LLR(0) corresponding to the voltage ranges B to G may be respectively recovered, which are, for example, "−14", "−8", "−3", "3", "8", and "14". According to the shift amount ΔS, second reliability information LLR(2) corresponding to the voltage ranges B to G may be respectively determined as "−11", "−5", "0", "6", "13", and "17". Thereafter, the second reliability information may be configured to replace or update the reliability information related to the first memory cells (or the voltage ranges B to G). The relevant operation details have been detailed above, and will not be repeated here.

Figure 12:
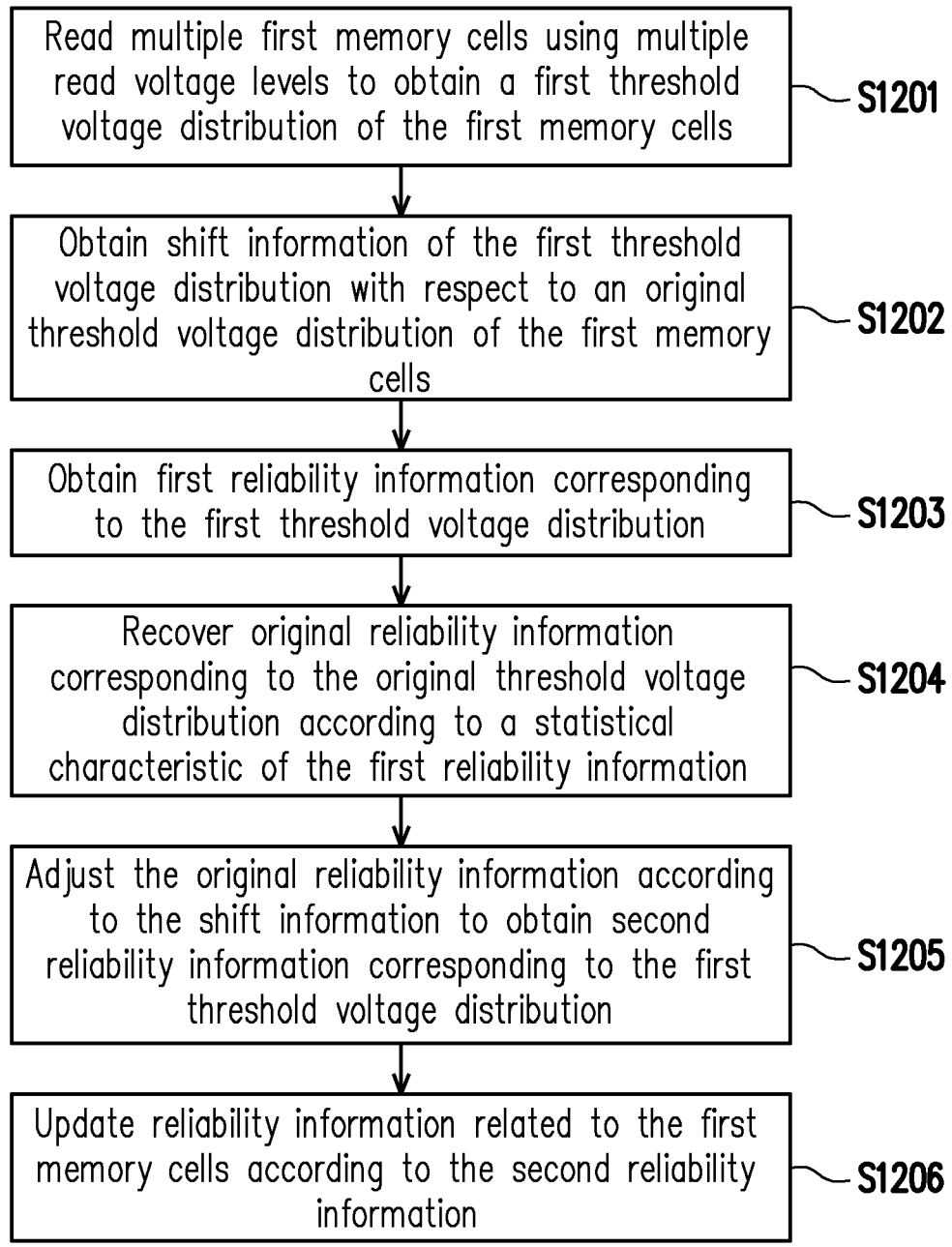
FIG. 12 is a flowchart of a memory control method according to an exemplary embodiment of the disclosure.

FIG. 12 is a flowchart of a memory control method according to an exemplary embodiment of the disclosure. Please refer to FIG. 12. In Step S1201, multiple first memory cells are read using multiple read voltage levels to obtain a first threshold voltage distribution of the first memory cells. In Step S1202, shift information of the first threshold voltage distribution with respect to an original threshold voltage distribution of the first memory cells is obtained. In Step S1203, first reliability information corresponding to the first threshold voltage distribution is obtained. In Step S1204, original reliability information corresponding to the original threshold voltage distribution is recovered according to a statistical characteristic of the first reliability information. In Step S1205, the original reliability information is adjusted according to the shift information to obtain second reliability information corresponding to the first threshold voltage distribution. In Step S1206, reliability information related to the first memory cells is updated according to the second reliability information.

However, each step in FIG. 12 has been described in detail as above, and will not be repeated here. It should be noted that each step in FIG. 12 may be implemented as multiple program codes or circuits, which is not limited by the disclosure. In addition, the method of FIG. 12 may be used in conjunction with the above exemplary embodiments or may be used alone, which is not limited by the disclosure.

In summary, after the threshold voltage distribution of the first memory cells experiences the voltage shift, the shift information between the current first threshold voltage distribution of the first memory cells and the original threshold voltage distribution of the first memory cells may be obtained. On the other hand, the first reliability information corresponding to the current first threshold voltage distribution of the first memory cells may be obtained and configured to recover the original reliability information corresponding to the original threshold voltage distribution. Then, the shift information may be configured to adjust the original reliability information to obtain the new reliability information (that is, the second reliability information) corresponding to the current first threshold voltage distribution of the first memory cells. Thereafter, the second reliability information may be configured to update the reliability information related to the first memory cells (or the remaining memory cells), thereby improving the decoding efficiency (for example, the decoding success rate) of the data subsequently read from the memory cells.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A memory control method for a rewritable non-volatile memory module, wherein the rewritable non-volatile memory module comprises a plurality of memory cells, the memory control method comprising:

reading a plurality of first memory cells in the memory cells using a plurality of read voltage levels to obtain a first threshold voltage distribution of the first memory cells;

obtaining shift information of the first threshold voltage distribution with respect to an original threshold voltage distribution of the first memory cells;

obtaining first reliability information corresponding to the first threshold voltage distribution;

recovering original reliability information corresponding to the original threshold voltage distribution according to a statistical characteristic of the first reliability information;

adjusting the original reliability information according to the shift information to obtain second reliability information corresponding to the first threshold voltage distribution; and updating reliability information related to the first memory cells according to the second reliability information.

2. The memory control method according to claim 1, wherein the read voltage levels are divided into a plurality of voltage ranges on the first threshold voltage distribution, and the first threshold voltage distribution comprises a memory cell number distribution presented based on the voltage ranges.

3. The memory control method according to claim 2, wherein the memory cell number distribution reflects a total number of memory cells whose threshold voltages fall within one of the voltage ranges.

4. The memory control method according to claim 3, wherein the step of obtaining the shift information of the first threshold voltage distribution with respect to the original threshold voltage distribution of the first memory cells comprises:
obtaining the shift information according to a difference between the total number and a predetermined number.

5. The memory control method according to claim 2, wherein the step of obtaining the shift information of the first threshold voltage distribution with respect to the original threshold voltage distribution of the first memory cells comprises:
determining a distribution curve according to the memory cell number distribution; and
obtaining the shift information according to a characteristic parameter of the distribution curve.

6. The memory control method according to claim 5, wherein the characteristic parameter comprises one of a slope value and a low point position of the distribution curve.

7. The memory control method according to claim 1, wherein the step of recovering the original reliability information corresponding to the original threshold voltage distribution according to the statistical characteristic of the first reliability information comprises:
determining an adjustment value according to the statistical characteristic of the first reliability information; and
adjusting the first reliability information according to the adjustment value to obtain the original reliability information.

8. A memory storage device, comprising:
a connection interface unit for coupling to a host system;
a rewritable non-volatile memory module, wherein the rewritable non-volatile memory module comprises a plurality of memory cells; and
a memory control circuit unit, coupled to the connection interface unit and the rewritable non-volatile memory module, wherein
the memory control circuit unit is configured to send a read command sequence to instruct to read a plurality of first memory cells in the memory cells using a plurality of read voltage levels to obtain a first threshold voltage distribution of the first memory cells,
the memory control circuit unit is further configured to obtain shift information of the first threshold voltage distribution with respect to an original threshold voltage distribution of the first memory cells,
the memory control circuit unit is further configured to obtain first reliability information corresponding to the first threshold voltage distribution,
the memory control circuit unit is further configured to recover original reliability information corresponding to the original threshold voltage distribution according to a statistical characteristic of the first reliability information,
the memory control circuit unit is further configured to adjust the original reliability information according to the shift information to obtain second reliability information corresponding to the first threshold voltage distribution, and
the memory control circuit unit is further configured to update reliability information related to the first memory cells according to the second reliability information.

9. The memory storage device according to claim 8, wherein the read voltage levels are divided into a plurality of voltage ranges on the first threshold voltage distribution, and the first threshold voltage distribution comprises a memory cell number distribution presented based on the voltage ranges.

10. The memory storage device according to claim 9, wherein the memory cell number distribution reflects a total number of memory cells whose threshold voltages fall within one of the voltage ranges.

11. The memory storage device according to claim 10, wherein the operation of obtaining the shift information of the first threshold voltage distribution with respect to the original threshold voltage distribution of the first memory cells comprises:
obtaining the shift information according to a difference between the total number and a predetermined number.

12. The memory storage device according to claim 9, wherein the operation of obtaining the shift information of the first threshold voltage distribution with respect to the original threshold voltage distribution of the first memory cells comprises:
determining a distribution curve according to the memory cell number distribution; and
obtaining the shift information according to a characteristic parameter of the distribution curve.

13. The memory storage device according to claim 12, wherein the characteristic parameter comprises one of a slope value and a low point position of the distribution curve.

14. The memory storage device according to claim 8, wherein the operation of recovering the original reliability information corresponding to the original threshold voltage distribution according to the statistical characteristic of the first reliability information comprises:
determining a first adjustment value according to the statistical characteristic of the first reliability information; and
adjusting the first reliability information according to the first adjustment value to obtain the original reliability information.

15. A memory control circuit unit for controlling a rewritable non-volatile memory module, wherein the rewritable non-volatile memory module comprises a plurality of memory cells, the memory control circuit unit comprising:
a host interface for coupling to a host system;
a memory interface for coupling to the rewritable non-volatile memory module; and
a memory management circuit, coupled to the host interface and the memory interface, wherein
the memory management circuit is configured to send a read command sequence to instruct to read a plurality of first memory cells in the memory cells using a plurality of read voltage levels to obtain a first threshold voltage distribution of the first memory cells,
the memory management circuit is further configured to obtain shift information of the first threshold voltage distribution with respect to an original threshold voltage distribution of the first memory cells,
the memory management circuit is further configured to obtain first reliability information corresponding to the first threshold voltage distribution, the memory management circuit is further configured to recover original reliability information corresponding to the original threshold voltage distribution according to a statistical characteristic of the first reliability information, the memory management circuit is further configured to adjust the original reliability information according to the shift information to obtain second reliability information corresponding to the first threshold voltage distribution, and the memory management circuit is further configured to update reliability information related to the first memory cells according to the second reliability information.

16. The memory control circuit unit according to claim 15, wherein the read voltage levels are divided into a plurality of voltage ranges on the first threshold voltage distribution, and the first threshold voltage distribution comprises a memory cell number distribution presented based on the voltage ranges.

17. The memory control circuit unit according to claim 16, wherein the memory cell number distribution reflects a total number of memory cells whose threshold voltages fall within one of the voltage ranges.

18. The memory control circuit unit according to claim 17, wherein the operation of obtaining the shift information of the first threshold voltage distribution with respect to the original threshold voltage distribution of the first memory cells comprises:

obtaining the shift information according to a difference between the total number and a predetermined number.

19. The memory control circuit unit according to claim 16, wherein the operation of obtaining the shift information of the first threshold voltage distribution with respect to the original threshold voltage distribution of the first memory cells comprises:

determining a distribution curve according to the memory cell number distribution; and obtaining the shift information according to a characteristic parameter of the distribution curve.

20. The memory control circuit unit according to claim 19, wherein the characteristic parameter comprises one of a slope value and a low point position of the distribution curve.

21. The memory control circuit unit according to claim 15, wherein the operation of recovering the original reliability information corresponding to the original threshold voltage distribution according to the statistical characteristic of the first reliability information comprises:

determining a first adjustment value according to the statistical characteristic of the first reliability information; and adjusting the first reliability information according to the first adjustment value to obtain the original reliability information.

* * * * *